United States Patent
Sotome et al.

(10) Patent No.: US 11,158,649 B2
(45) Date of Patent: Oct. 26, 2021

(54) SEMICONDUCTOR STORAGE DEVICE WITH COLUMNAR BODY HAVING IMPURITY CONTAINING CHANNEL FILM

(71) Applicant: Toshiba Memory Corporation, Tokyo (JP)

(72) Inventors: Shinichi Sotome, Yokkaichi Mie (JP); Tatsufumi Hamada, Nagoya Aichi (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 66 days.

(21) Appl. No.: 16/558,541

(22) Filed: Sep. 3, 2019

(65) Prior Publication Data
US 2020/0273880 A1    Aug. 27, 2020

(30) Foreign Application Priority Data
Feb. 27, 2019  (JP) .............................. JP2019-034160

(51) Int. Cl.
| | |
|---|---|
| H01L 27/11524 | (2017.01) |
| H01L 27/11582 | (2017.01) |
| H01L 23/48 | (2006.01) |
| H01L 27/1157 | (2017.01) |
| H01L 27/11556 | (2017.01) |
| H01L 21/28 | (2006.01) |

(Continued)

(52) U.S. Cl.
CPC ...... *H01L 27/11582* (2013.01); *H01L 23/481* (2013.01); *H01L 27/1157* (2013.01); *H01L 27/11524* (2013.01); *H01L 27/11556* (2013.01); *H01L 29/40117* (2019.08); *H01L 29/66666* (2013.01); *H01L 29/66787* (2013.01); *H01L 29/7827* (2013.01)

(58) Field of Classification Search
CPC ......... H01L 27/11521; H01L 27/11524; H01L 27/11551; H01L 27/11556; H01L 27/11568; H01L 27/1157; H01L 27/11578; H01L 27/11582; H01L 29/40117; H01L 29/66666; H01L 29/66787; H01L 29/7827

See application file for complete search history.

(56) References Cited

U.S. PATENT DOCUMENTS

| | | |
|---|---|---|
| 10,050,087 B1 | 8/2018 | Kabuyanagi et al. |
| 10,700,089 B1 * | 6/2020 | Hojo ................. H01L 27/11575 |
| 2017/0012051 A1 * | 1/2017 | Lee ................... H01L 29/40117 |

(Continued)

FOREIGN PATENT DOCUMENTS

| | | |
|---|---|---|
| JP | 2018-157006 A | 10/2018 |
| TW | 201834218 A | 9/2018 |

*Primary Examiner* — Stephen W Smoot
(74) *Attorney, Agent, or Firm* — Kim & Stewart LLP

(57) ABSTRACT

A semiconductor storage device includes a stacked body and a columnar body. The stacked body includes a plurality of conductive layers and a plurality of insulating layers that are alternately stacked in a first direction. The columnar body extends through the stacked body in the first direction and includes a core portion, a channel film, a tunnel oxide film, and a charge storage film in this order from a center portion thereof. The channel film has a first region in contact with the core portion and a second region in contact with the tunnel oxide film. The first region is a semiconductor doped with impurities. The second region is a semiconductor. A concentration of the impurities in the second region is lower than that in the first region.

10 Claims, 18 Drawing Sheets

(51) Int. Cl.
  *H01L 29/78* (2006.01)
  *H01L 29/66* (2006.01)

(56) References Cited

U.S. PATENT DOCUMENTS

2017/0263623 A1* 9/2017 Zhang .................... H01L 23/528
2019/0198521 A1* 6/2019 Komiya ............ H01L 27/11556
2020/0395412 A1* 12/2020 Lee .................... G11C 13/0097

* cited by examiner

US 11,158,649 B2

SEMICONDUCTOR STORAGE DEVICE WITH COLUMNAR BODY HAVING IMPURITY CONTAINING CHANNEL FILM

CROSS-REFERENCE TO RELATED APPLICATION

This application is based upon and claims the benefit of priority from Japanese Patent Application No. 2019-034160, filed Feb. 27, 2019, the entire contents of which are incorporated herein by reference.

FIELD

Embodiments described herein relate generally to a semiconductor storage device and a method of manufacturing the same.

BACKGROUND

A NAND flash memory including three-dimensionally stacked memory cells are is known.

DETAILED DESCRIPTION

Figure 1:
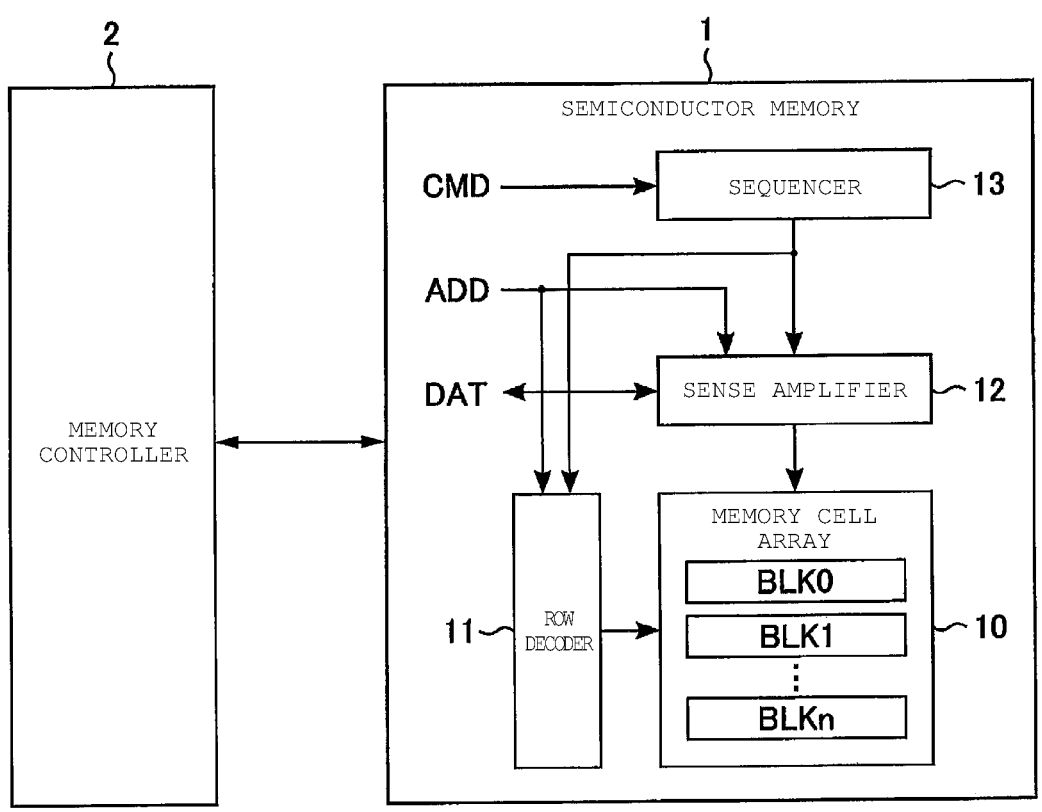
FIG. 1 is a block diagram illustrating a system configuration of a semiconductor memory according to a first embodiment.

Embodiments provide a semiconductor storage device capable of increasing a cell current and a manufacturing method thereof.

In general, according to an embodiment, a semiconductor storage device includes a stacked body and a columnar body. The stacked body includes a plurality of conductive layers and a plurality of insulating layers that are alternately stacked in a first direction. The columnar body extends through the stacked body in the first direction and includes a core portion, a channel film, a tunnel oxide film, and a charge storage film in this order from a center portion thereof. The channel film has a first region in contact with the core portion and a second region in contact with the tunnel oxide film. The first region is a semiconductor doped with impurities. The second region is a semiconductor. A concentration of the impurities in the second region is lower than that in the first region.

Hereinafter, a semiconductor storage device and a manufacturing method of thereof according to the embodiment will be described with reference to the drawings. The drawings are schematic or conceptual, and a relationship between a thickness and a width of each portion, a ratio of sizes between the portions, and the like are not necessarily the same as the actual ones. In the following description, configurations having the same or similar functions are denoted by the same reference numerals. Duplicate descriptions of the configurations may be omitted. Numerals after reference symbols are used to distinguish between elements having the same configuration. When it is not necessary to distinguish between elements indicated by the reference symbol, the elements are referred to only by the reference symbol.

First, a +X direction, a −X direction, a +Y direction, a −Y direction, a +Z direction, and a −Z direction are defined. The +X direction, the −X direction, the +Y direction, and the −Y direction are substantially parallel to a surface of a semiconductor substrate 20 (see FIG. 4) which will be described below. The +X direction faces another string unit SU1 is a direction from one string unit SU0 which will be described below (see FIG. 3). The −X direction is an opposite direction to the +X direction. When the +X direction is not distinguished from the −X direction, each direction is simply referred to as an "X direction". The +Y direction and the −Y direction intersect (for example, substantially orthogonal to) the X direction. The +Y direction and the −Y direction are opposite to each other. When the +Y direction and the −Y direction are not distinguished from each other, each direction is simply referred to as an "Y direction". The +Z direction and the −Z direction intersect (for example, substantially orthogonal to) the X direction and the Y direction. The +Z direction faces a stacked body 30 from the semiconductor substrate 20 which will be described below (see FIG. 4). The −Z direction is an opposite direction to the +Z direction. When the +Z direction and the −Z direction are not distinguished from each other, each direction is simply referred to as a "Z direction". In the present specification, the "+Z direction" may be referred to as an "upper", and the "−Z direction" may be referred to as a "lower". However, these expressions are for the sake of convenience and do not define the direction of gravity. In the present embodiment, the +Z direction is an example of a "first direction".

In the present specification, a "connection" is not limited to a physical connection and includes an electrical connection. Also, the term "extends in the A direction" described in the present specification means, for example, that a dimension in the A direction is larger than the smallest dimension among the dimensions in the X direction, the Y direction, and the Z direction. The "A direction" is a random direction.

First Embodiment

First, an overall configuration of a semiconductor storage device according to the present embodiment will be described.

A semiconductor memory 1 according to the present embodiment is a nonvolatile semiconductor storage device and is, for example, a NAND flash memory.

FIG. 1 is a block diagram illustrating a system configuration of the semiconductor memory 1. The semiconductor memory 1 includes, for example, a memory cell array 10, a row decoder 11, a sense amplifier 12, and a sequencer 13.

The memory cell array 10 includes a plurality of blocks BLK0 to BLKn (n is an integer larger than or equal to 1). The block BLK is a set of nonvolatile memory cell transistors MT (see FIG. 2). The memory cell array 10 is provided with a plurality of bit lines and a plurality of word lines. Each memory cell transistor MT is associated with one bit line and one word line. A detailed configuration of the memory cell array 10 will be described below.

The row decoder 11 selects one block BLK based on an address information ADD received from an external memory controller 2. The row decoder 11 controls a write operation and a read operation of data to the memory cell array 10 by applying desirable voltages to the plurality of word lines, respectively.

The sense amplifier 12 applies a desirable voltage to each bit line according to write data DAT received from the memory controller 2. The sense amplifier 12 determines data stored in the memory cell transistor MT based on a voltage of the bit line and transmits the determined read data DAT to the memory controller 2.

The sequencer 13 controls an overall operation of the semiconductor memory 1 based on a command CMD received from the memory controller 2.

The semiconductor memory 1 and the memory controller 2 described above may configure one semiconductor device by a combining the semiconductor memory and the memory controller. For example, a memory card such as an SD (registered trademark) card, a solid state drive (SSD), and the like may be used as the semiconductor device.

Next, an electrical configuration of the memory cell array 10 will be described.

Figure 2:
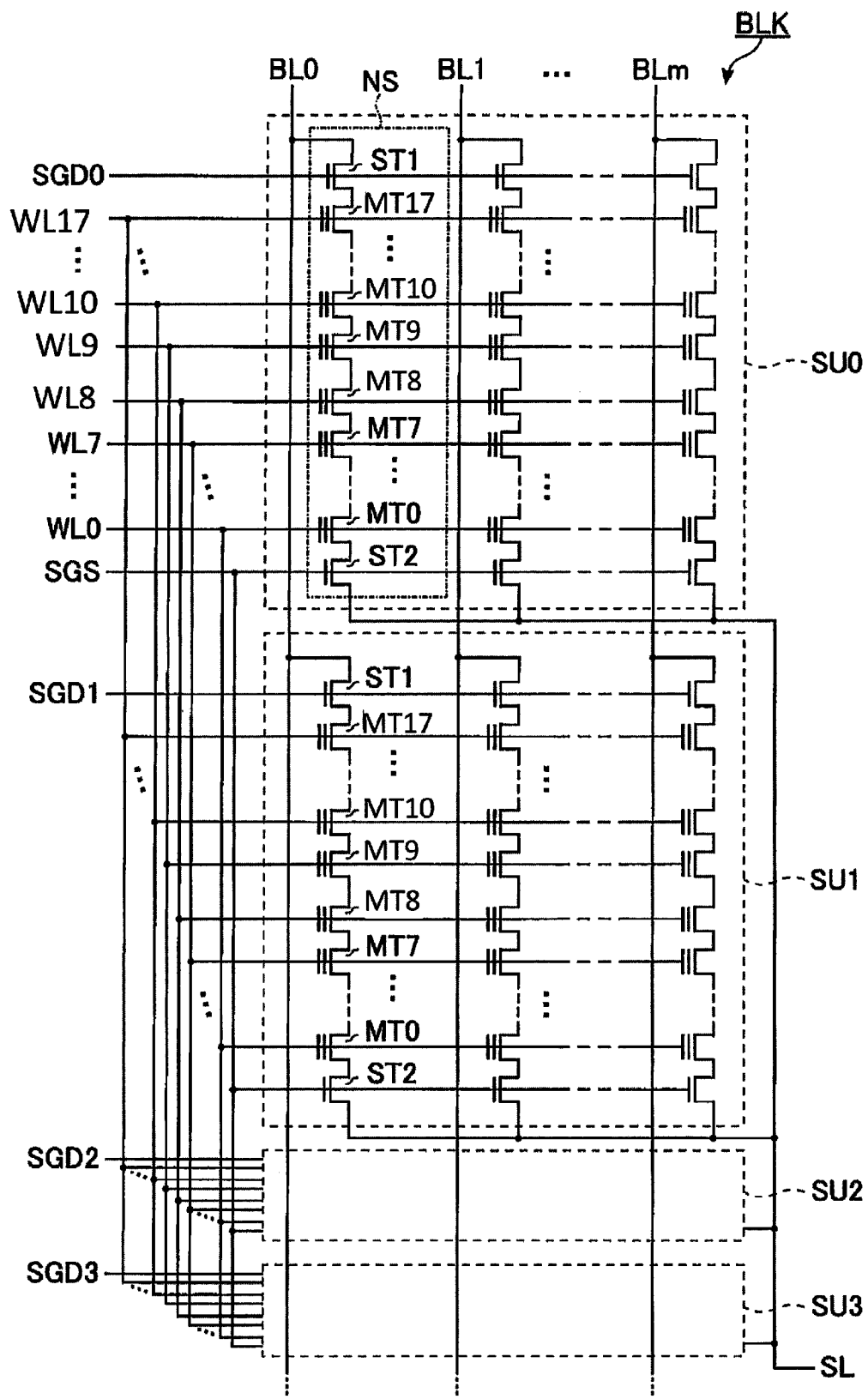
FIG. 2 is a diagram illustrating an equivalent circuit of a memory cell array according to the first embodiment.

FIG. 2 is a diagram illustrating an equivalent circuit of the memory cell array 10 and illustrates one block BLK extracted therefrom. The block BLK includes a plurality of (for example, four) string units SU (SU0 to SU3).

Each string unit SU is a set of a plurality of NAND strings NS. One end of each NAND string NS is connected to a bit line BL (one of BL0 to BLm (m is an integer larger than or equal to 1)). The other end of the NAND strings NS is connected to a source line SL. Each NAND string NS includes a plurality (for example, 18) of memory cell transistors MT (MT0 to MT17), a first select transistor ST1, and a second select transistor ST2.

The plurality of memory cell transistors MT (MT0 to MT17) are electrically connected in series to one another. The memory cell transistor MT includes a control gate and a charge storage film and stores data in a non-volatile manner. The memory cell transistor MT stores charges in the charge storage film according to a voltage applied to the control gate. The control gate of the memory cell transistor MT is connected to the corresponding word line WL (one of WL0 to WL17). The memory cell transistor MT is electrically connected to the row decoder 11 via the word line WL.

The first select transistor ST1 is connected between the plurality of memory cell transistors MT (MT0 to MT17) and the corresponding bit line BL. A drain of the first select transistor ST1 is connected to the bit line BL. A source of the first select transistor ST1 is connected to the plurality of memory cell transistors MT. A control gate of the first select transistor ST1 is connected to the corresponding select gate line SGD (any one of SGD0 to SGD3). The first select transistor ST1 is electrically connected to the row decoder 11 via the select gate line SGD. The first select transistor ST1 connects the NAND string NS to the bit line BL when a predetermined voltage is applied to the select gate line SGD.

The second select transistor ST2 is connected between the plurality of memory cell transistors MT (MT0 to MT17) and the source line SL. A drain of the second select transistor ST2 is connected to the plurality of memory cell transistors MT. A source of the second select transistor ST2 is connected to the source line SL. A control gate of the second select transistor ST2 is connected to the select gate line SGS. The second select transistor ST2 is electrically connected to the row decoder 11 via the select gate line SGS. The second select transistor ST2 connects the NAND string NS to the source line SL when a predetermined voltage is applied to the select gate line SGS.

Next, a physical configuration of the memory cell array 10 will be described.

Figure 3:
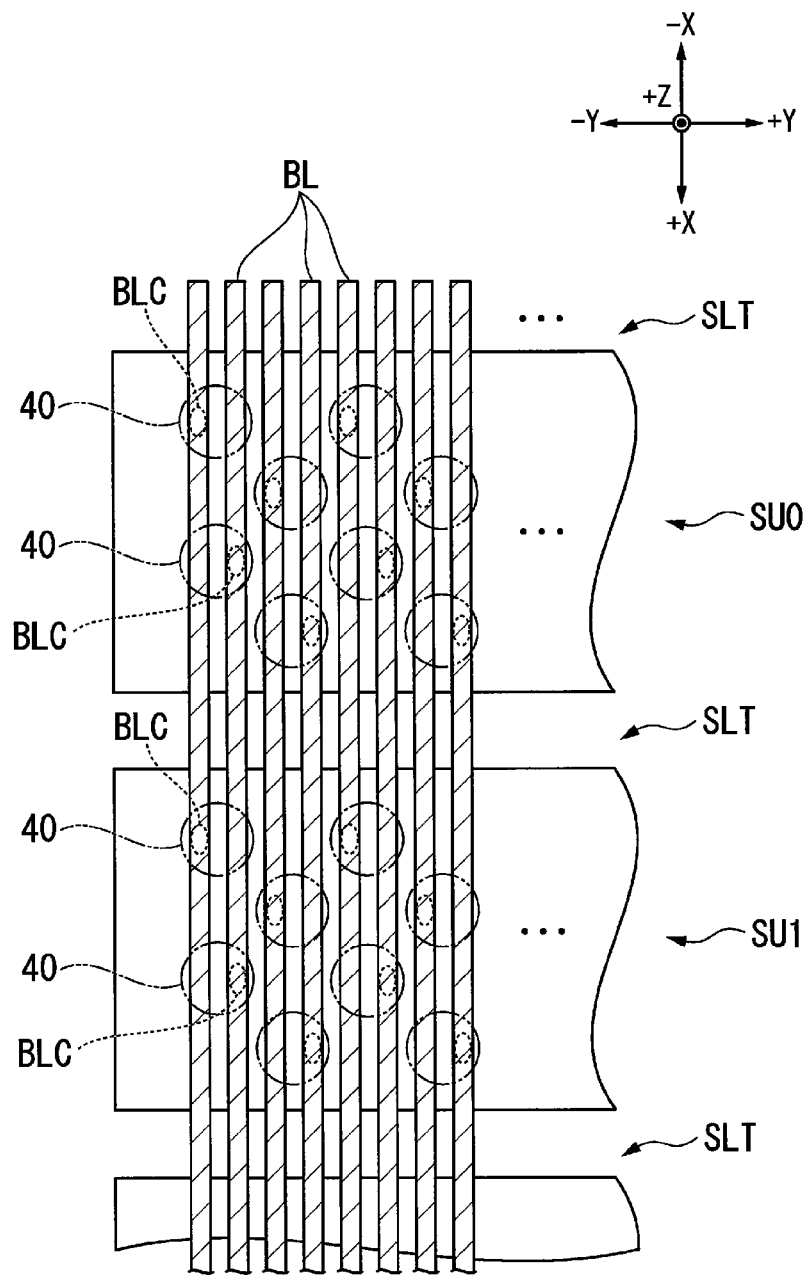
FIG. 3 illustrates a schematic plan view of a partial region of the memory cell array according to the first embodiment.

FIG. 3 illustrates a schematic plan view of a partial region of the memory cell array 10. For example, the plurality of string units SU are arranged in the X direction and extend in the Y direction. The plurality of string units SU are separated from one another by slits SLT filled with an insulating material. Each string unit SU includes a plurality of columnar bodies 40 extending in the Z direction. Each columnar body 40 is connected to one bit line BL via a contact plug BLC which will be described below. For example, the bit line BL extends in the X direction.

Figure 4:
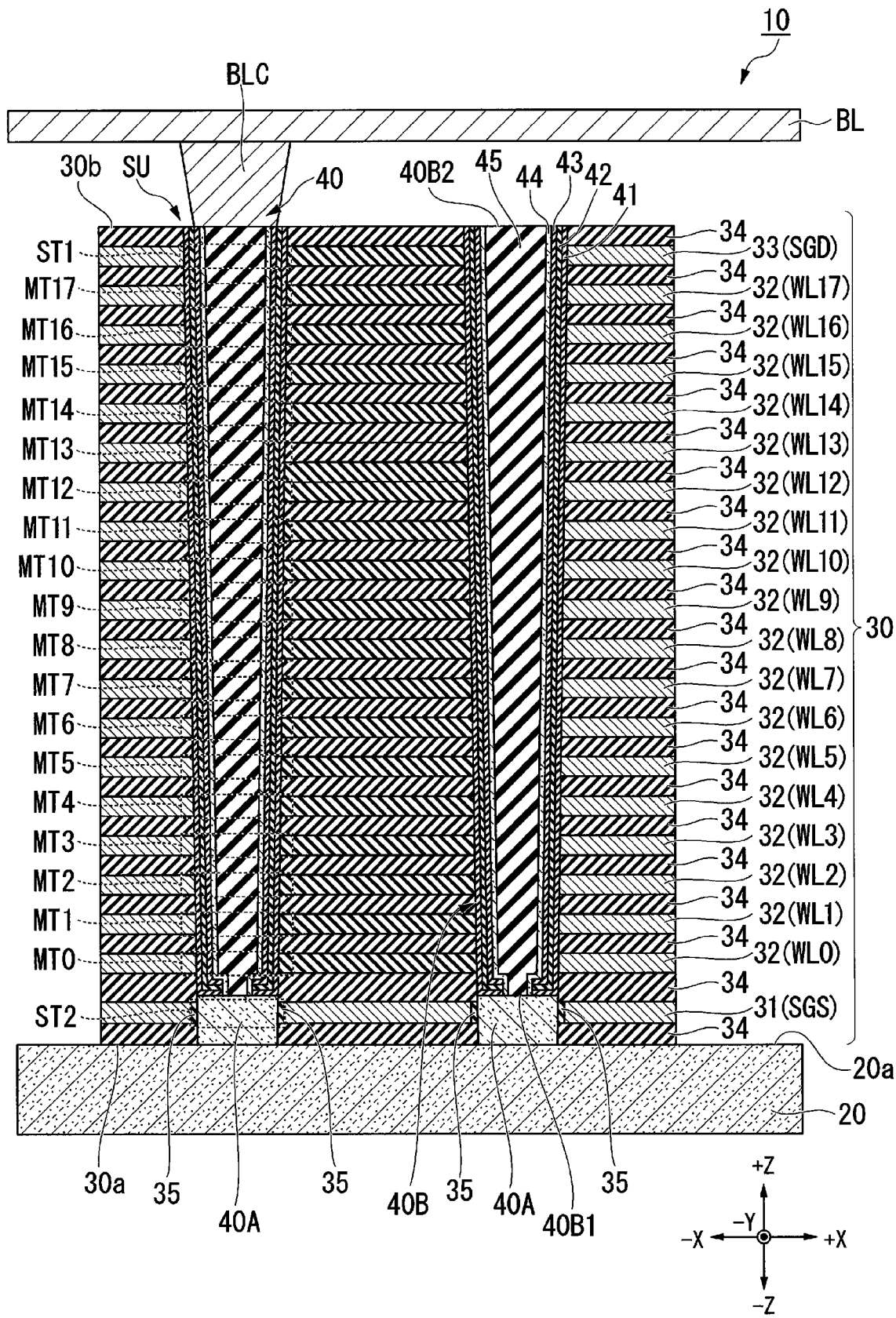
FIG. 4 is a cross-sectional diagram illustrating the partial region of the memory cell array according to the first embodiment.

FIG. 4 is a cross-sectional diagram illustrating the partial region of the memory cell array 10. The memory cell array 10 includes, for example, the semiconductor substrate 20, the stacked body 30, the columnar body 40, the contact plug BLC, and the bit line BL.

The semiconductor substrate 20 has a surface 20$a$ in the X direction and the Y direction. The semiconductor substrate 20 may be a semiconductor substrate or a conductive film disposed on a substrate via an insulating material.

The stacked body 30 is provided on the semiconductor substrate 20. The stacked body 30 includes one conductive layer 31, a plurality of conductive layers 32, one conductive layer 33, and a plurality of insulating layers 34. The plurality of conductive layers 31, 32, 33 and the plurality of insulating layers 34 are stacked in the Z direction.

The conductive layers 31, 32, and 33 are, for example, tungsten. The conductive layer 31 is the lowermost conductive layer in the stacked body 30. The conductive layer 31 functions as the select gate line SGS. The conductive layer 33 is the uppermost conductive layer in the stacked body 30. The conductive layer 33 functions as the select gate line SGD. The plurality of conductive layers 32 are located above the conductive layer 31 and located below the conductive layer 33. The plurality of conductive layers 32 function as the word lines WL0 to WL17, respectively. Each of the conductive layers 31, 32, and 33 is formed in a plate shape in the X direction and the Y direction. Each of the conductive layers 31, 32, and 33 may have a block insulating film at an interface with the insulating layer 34 and at an interface with the columnar body 40.

The insulating layers 34 are provided between the conductive layer 31 and the conductive layer 32, between the plurality of conductive layers 32, and between the conductive layer 32 and the conductive layer 33. The insulating layer 34 insulates each of the conductive layers 31, 32, and 33 from each other. Each of the insulating layers 34 is formed in a plate shape in the X direction and the Y direction.

The columnar body 40 functions as, for example, one NAND string NS. The columnar body 40 is provided in the stacked body 30 in the Z direction. The columnar body 40 is provided from an upper surface 30$b$ of the stacked body 30 to a lower surface 30$a$ thereof in the Z direction. The columnar body 40 includes first columnar portions 40A and second columnar portions 40B.

The first columnar portions 40A are located between the semiconductor substrate 20 and the second columnar portions 40B, and are in contact with the semiconductor substrate 20 and the second columnar portions 40B, respectively. The first columnar portions 40A are provided on a surface 20a of the semiconductor substrate 20 to form a projection portion for the surface 20a of the semiconductor substrate 20. That is, the first columnar portion 40A protrudes from the surface 20a of the semiconductor substrate 20 in the +Z direction. The first columnar portion 40A is, for example, an epitaxial silicon layer formed by epitaxially growing silicon on the surface 20a of the semiconductor substrate 20.

A part of the first columnar portion 40A faces the conductive layer 31 via the insulating film 35. A part where the first columnar portion 40A intersects the conductive layer 31 functions as the second select transistor ST2.

The second columnar portion 40B is located above the first columnar portion 40A. The second columnar portion 40B is located in the stacked body 30. A lower end 40B1 of the second columnar portion 40B is in contact with the first columnar portion 40A. Portions where the second columnar portion 40B intersects the plurality of conductive layers 32 function as the memory cell transistors MT (MT0 to MT17). A portion where the second columnar portion 40B intersects the conductive layer 33 functions as the first select transistor ST1. The conductive layer 32 on the low layer side may be used as the gate electrode of the second select transistor ST2.

An upper end 40B2 of the second columnar portion 40B is connected to the bit line BL via the contact plug BLC. The contact plug BLC is a connection member of a columnar shape, an inverted truncated cone shape or the like formed of a conductive material. For example, a width of the second columnar portion 40B gradually decreases in the X direction and the Y direction when proceeding from the upper end 40B2 to the lower end 40B1. The second columnar portion 40B is, for example, circular or elliptical when viewed from the Z direction.

The second columnar portion 40B includes a block insulating film 41, an insulating film 42, a tunnel oxide film 43, a channel film 44, and a core portion 45. The block insulating film 41 is provided on an inner wall of a hole penetrating the stacked body 30 in the Z direction. The insulating film 42 is provided on an inner wall of the block insulating film 41. The insulating film 42 functions as a charge storage film. The tunnel oxide film 43 is provided on an inner wall of the insulating film 42. The channel film 44 is provided on an inner wall of the tunnel oxide film 43. The channel film 44 functions as channels of the transistors configuring the NAND string NS. The core portion 45 is provided in a region surrounded by the tunnel oxide film 43. That is, the second columnar portion 40B includes the core portion 45, the channel film 44, the tunnel oxide film 43, the insulating film 42, and the block insulating film 41 in this order from an inner side thereof. Another film or layer may or may not be provided therebetween. A core side of the second columnar portion 40B is the inner side. Instead of the insulating film 42, a floating gate of which periphery is covered with an insulating material may be used as the charge storage film.

The block insulating film 41 is, for example, silicon oxide, aluminum oxide, or zirconium oxide. The insulating film 42 is, for example, silicon nitride. The tunnel oxide film 43 is, for example, the silicon oxide. The channel film 44 is, for example, polysilicon partially doped with impurities. The core portion 45 is, for example, the silicon oxide.

Figure 5:
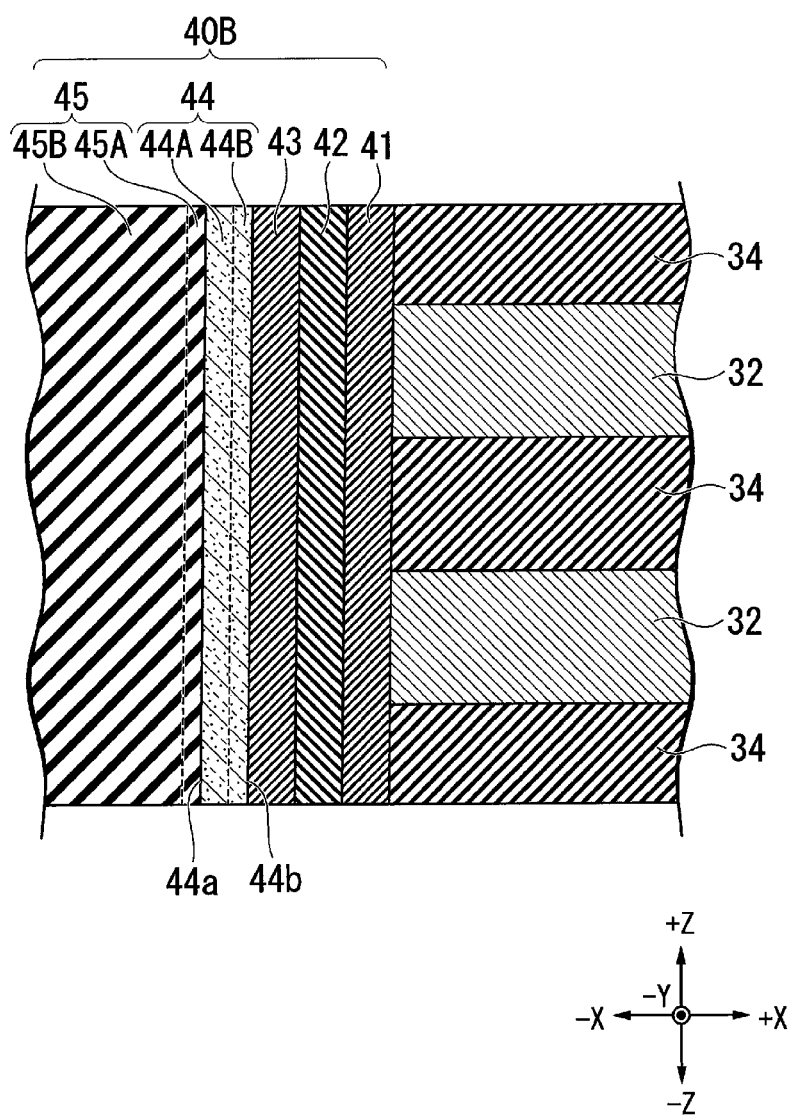
FIG. 5 is an enlarged cross-sectional diagram of a vicinity of a columnar body of the memory cell array according to the first embodiment.

FIG. 5 is an enlarged cross-sectional diagram illustrating a vicinity of the channel film 44, the tunnel oxide film 43, the insulating film 42, and the block insulating film 41 of the second columnar portion 40B.

The channel film 44 has a first region 44A and a second region 44B. The first region 44A is in contact with the core portion 45 and extends from a first surface 44a toward the tunnel oxide film 43. The first surface 44a is a surface on the core portion 45 side of the channel film 44. The first region 44A includes a semiconductor doped with impurities. The first region 44A is, for example, a region where a concentration of the impurities is higher than or equal to $1\times10^{20}/cm^3$ and lower than or equal to $1\times10^{21}/cm^3$.

The second region 44B is in contact with the tunnel oxide film 43 and extends from a second surface 44b toward the core portion 45. The second surface 44b is a surface of the channel film 44 on the tunnel oxide film 43 side. The second region 44B has, for example, a lower concentration of impurities than the first region 44A. The second region 44B does not contain, for example, the impurities. Here, "does not contain impurities" means that inevitably contained impurities are allowed.

The concentration of impurities in the first surface 44a of the channel film 44 is higher than the concentration of impurities in the second surface 44b. In the channel film 44, for example, the concentration of impurities gradually decreases from the first surface 44a to the second surface 44b. The concentrations of impurities of the first surface 44a and the second surface 44b are determined by, for example, secondary ion mass spectrometry (SIMS).

The impurities contained in the channel film 44 are selected from, for example, a group configuring carbon (C), phosphorus (P), boron (B), and germanium (Ge). The impurity contained in the channel film 44 is preferably carbon (C). The carbon has a small fluctuation to a threshold voltage of a cell and also has a small influence on a crystal grain size of polysilicon.

The core portion 45 has, for example, a first region 45A and a second region 45B. The first region 45A is in contact with the channel film 44 and extends from an interface with the channel film 44 toward a core side of the core portion 45. The second region 45B is located closer to the core side of the core portion 45 than the first region 45A. The first region 45A contains, for example, impurities. The impurities contained in the first region 45A are the same as the impurities contained in the channel film 44.

Next, an example of a manufacturing method of the memory cell array 10 will be described.

The manufacturing method of the memory cell array 10 includes, for example, a stacking process, a hole forming process, a single crystal growing process, an insulation film forming process, an opening forming process, a channel film forming process, a slimming process, a core portion forming process, and a replacement process. FIGS. 6 to 14 are cross-sectional diagrams illustrating the respective manufacturing process of the memory cell array 10. Hereinafter, a process of stacking a replacement material and an insulating material to a process of forming the word line WL will be described.

Figure 6:
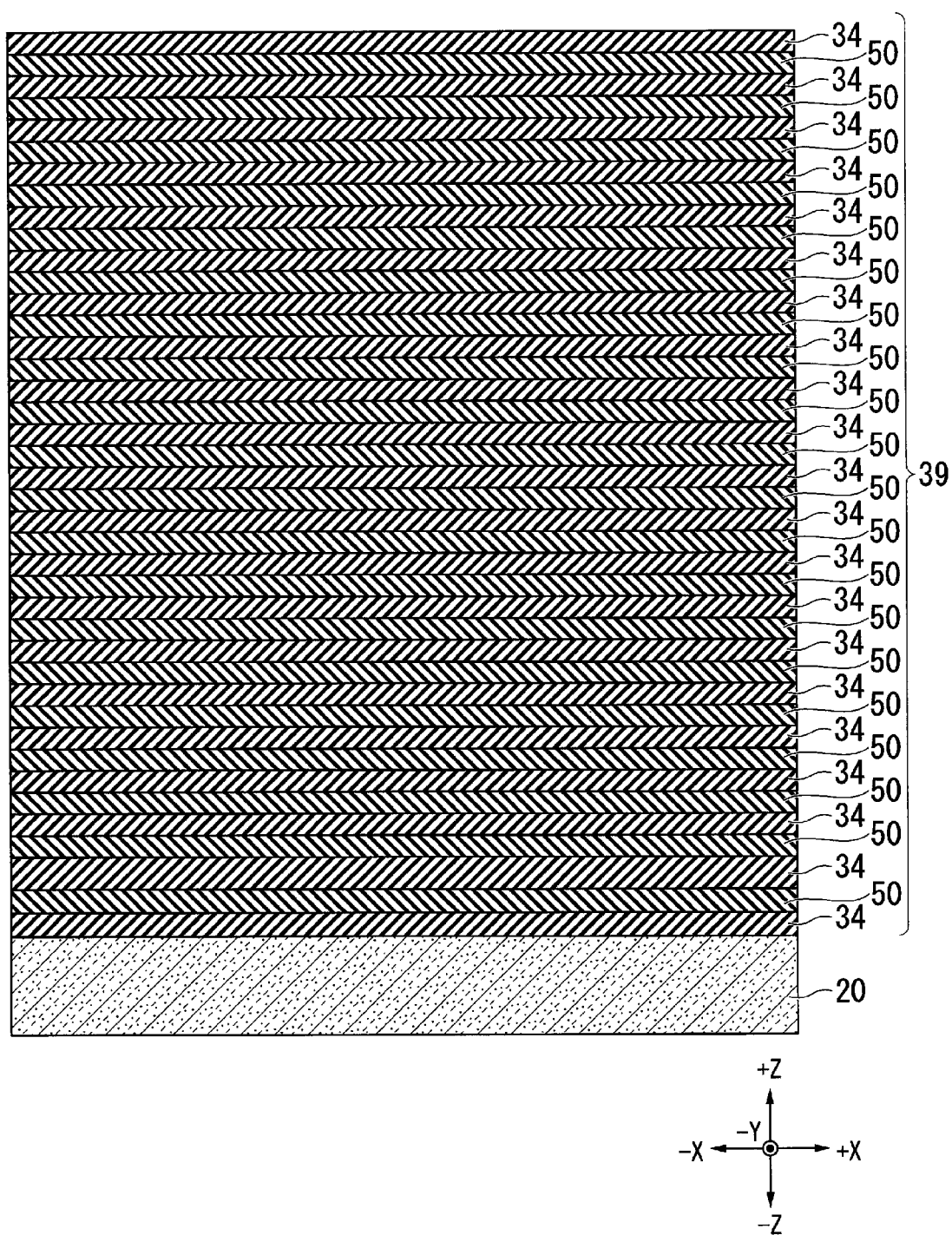
FIGS. 6-14 are cross-sectional diagrams illustrating an example of a manufacturing process of the memory cell array according to the first embodiment.

FIG. 6 is a cross-sectional diagram illustrating the stacking process. In the stacking process, the insulating layer 34 and a replacement material 50 are alternately stacked on the semiconductor substrate 20. A plurality of the insulating layers 34 and a plurality of the replacement materials 50 are alternately stacked to form the stacked body 39. The replacement material 50 is a nitride film such as silicon nitride (SiN).

Figure 7:
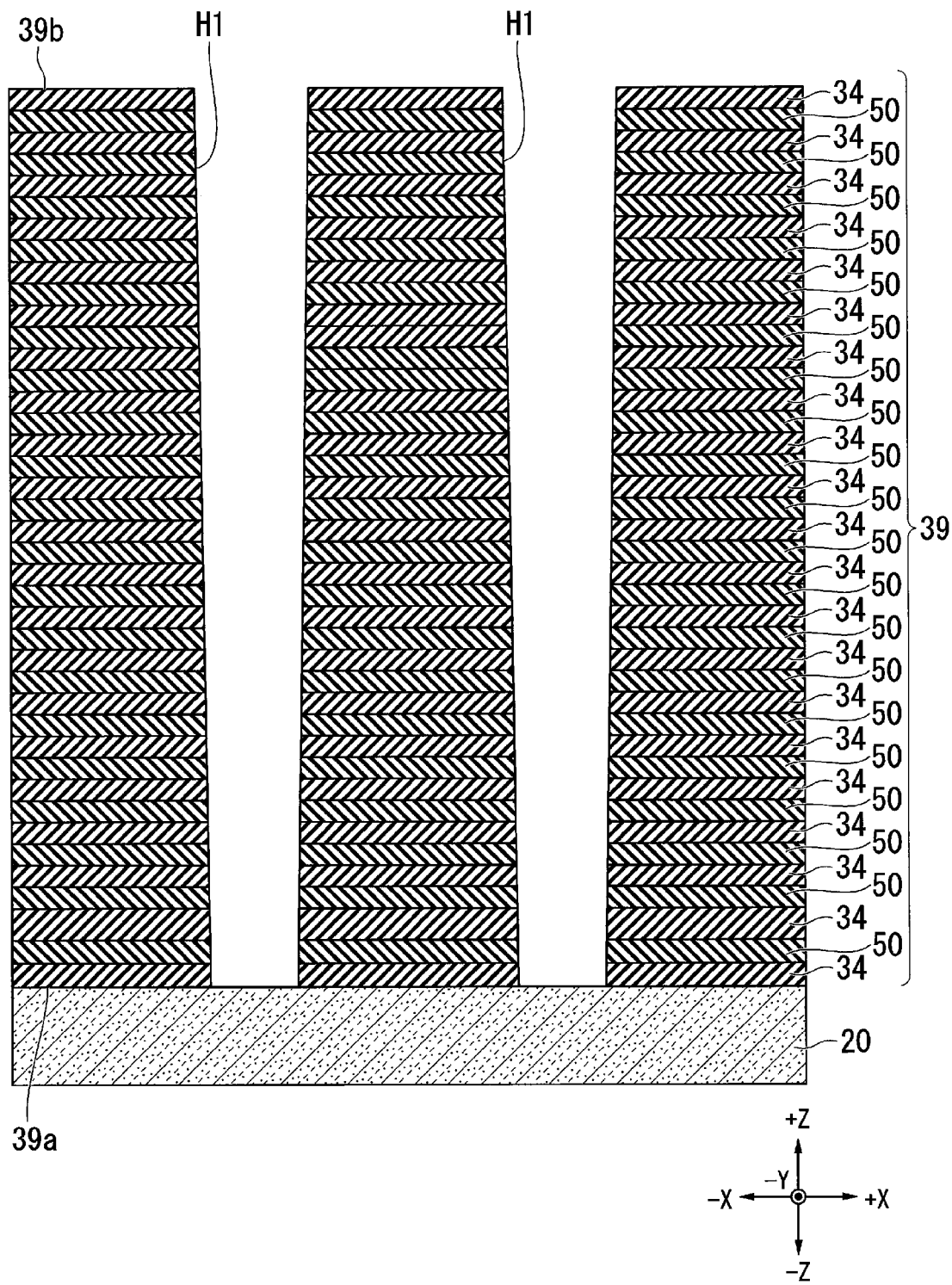

FIG. 7 is a cross-sectional diagram illustrating the hole forming process. In the hole forming process, holes H1 are formed in the stacked body 39. The hole H1 extends from an upper surface 39b to a lower surface 39a of the stacked body 39. The hole H1 is formed by photolithography and anisotropic etching. For example, reactive ion etching (RIE) may be used as the anisotropic etching.

Figure 8:
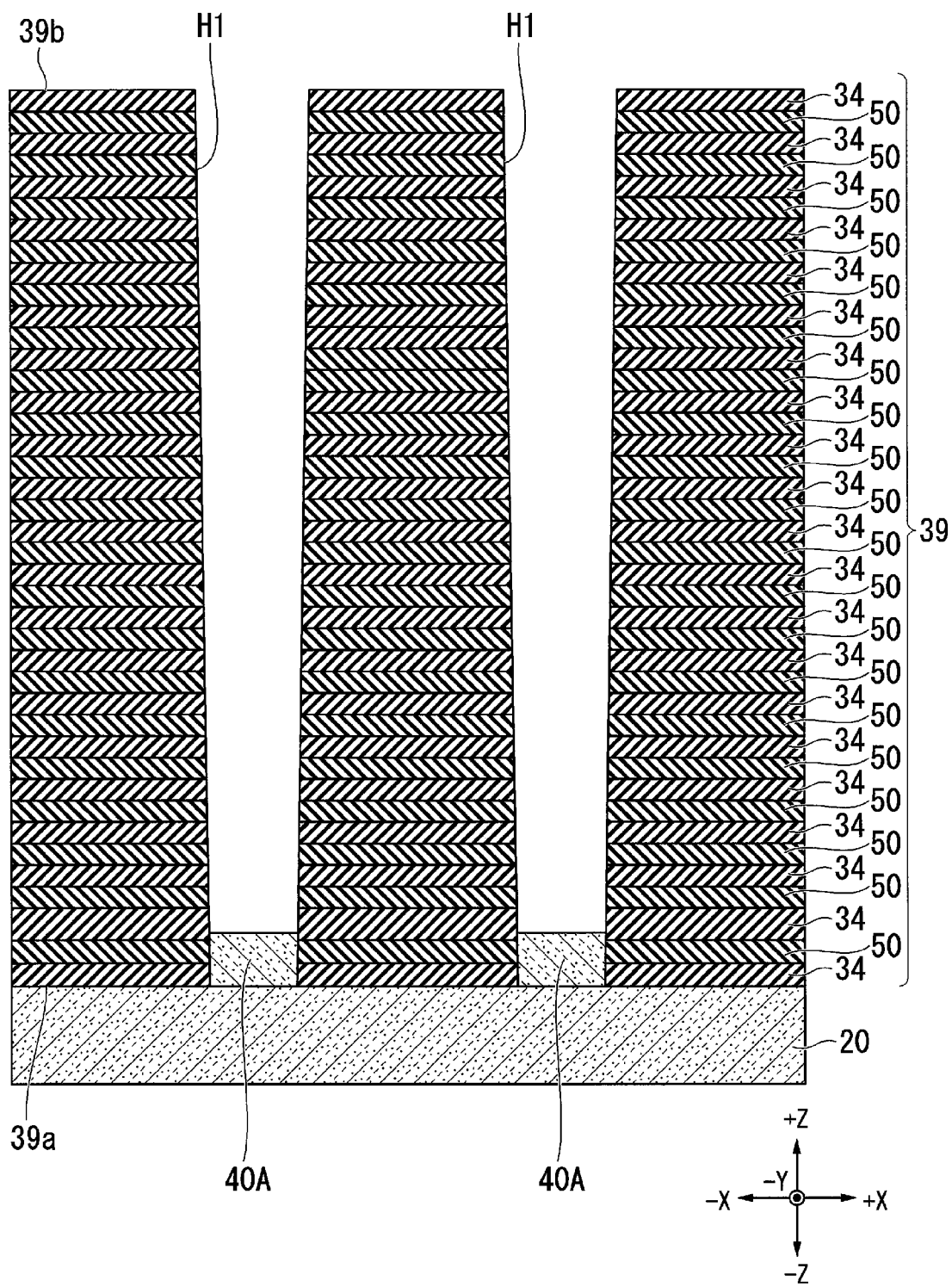

FIG. 8 is a cross-sectional diagram illustrating the single crystal growing process. A silicon single crystal is epitaxially grown in the hole H1. Thereby, the first columnar portion 40A is formed in a lower end portion of the hole H1.

Figure 9:
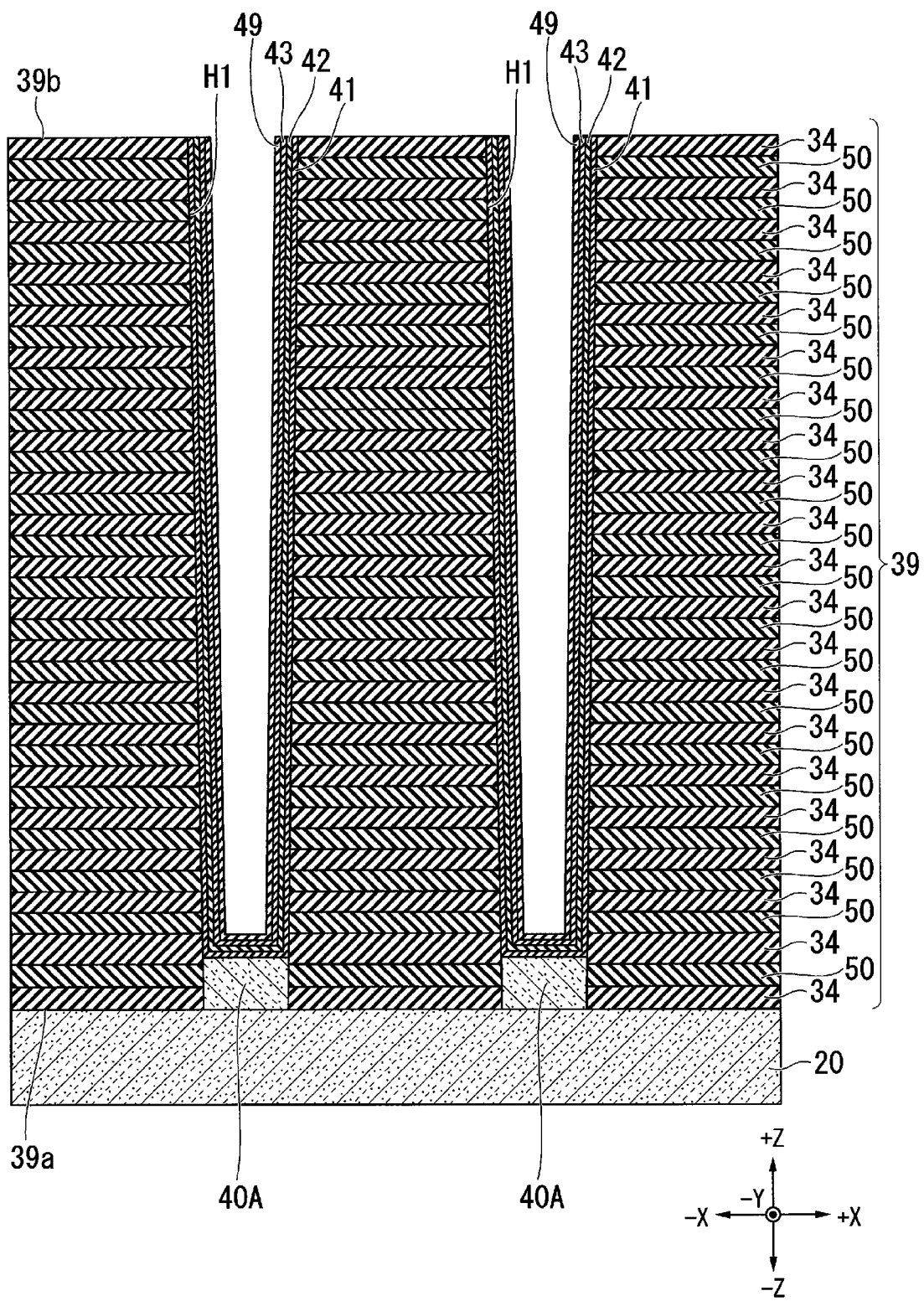

FIG. 9 is a cross-sectional diagram illustrating the insulating film forming process. The block insulating film 41, the insulating film 42, the tunnel oxide film 43, and a cover film 49 are stacked in this order on the inner wall of the hole H1. The block insulating film 41, the insulating film 42, the tunnel oxide film 43, and the cover film 49 are each formed in a cylindrical shape having a bottom. The cover film 49 protects the tunnel oxide film 43 from etching in the opening forming process which will be described below. The cover film 49 is, for example, amorphous silicon.

Figure 10:
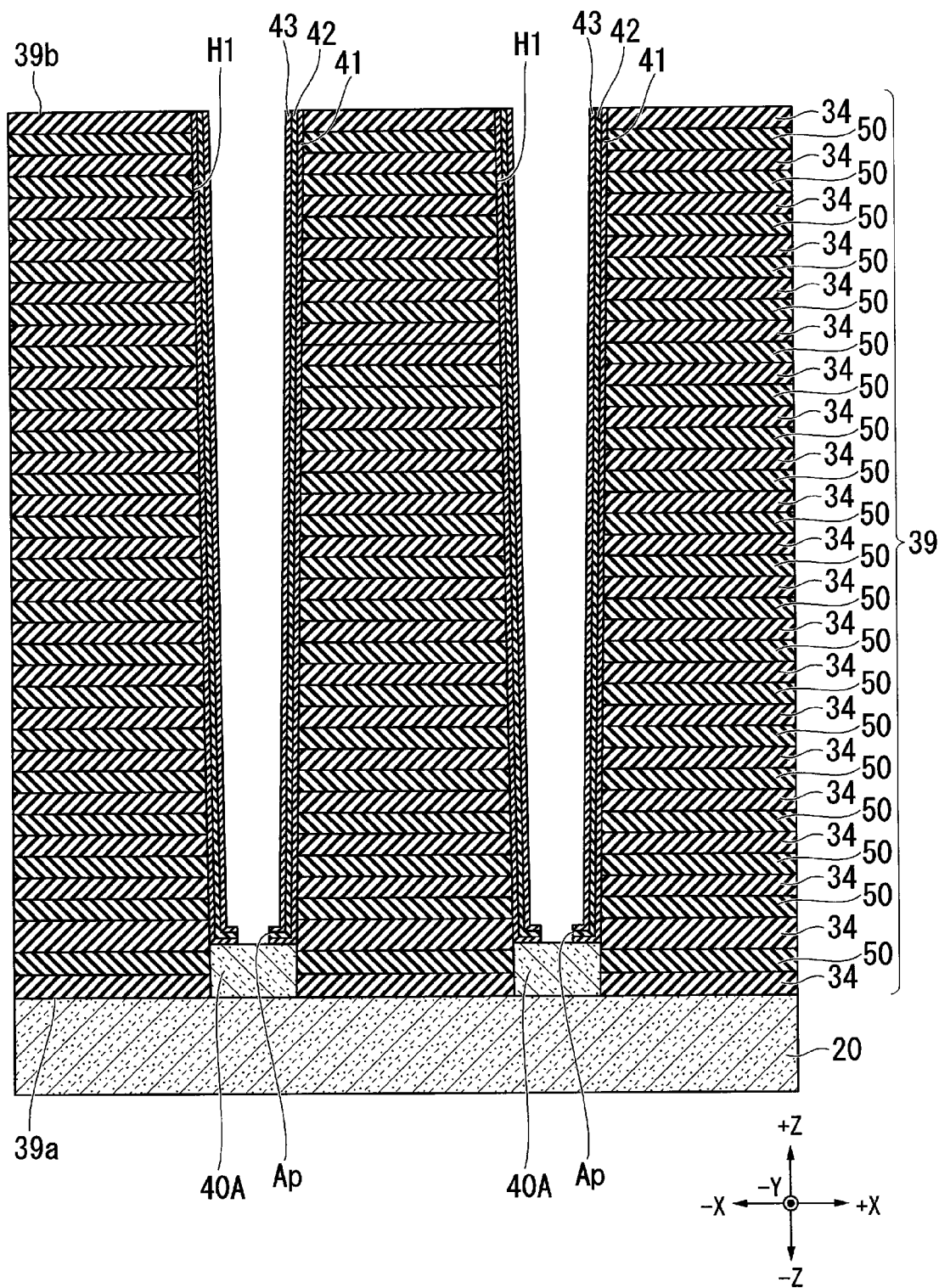

FIG. 10 is a cross-sectional diagram illustrating the opening forming process. An opening Ap is formed at the bottom of the block insulating film 41, the insulating film 42, the tunnel oxide film 43, and the cover film 49. The opening Ap is formed by, for example, the RIE. The opening Ap extends to the upper surface of the first columnar portion 40A. After the opening Ap is formed, the cover film 49 is removed. The cover film 49 is removed by, for example, etching.

Figure 11:
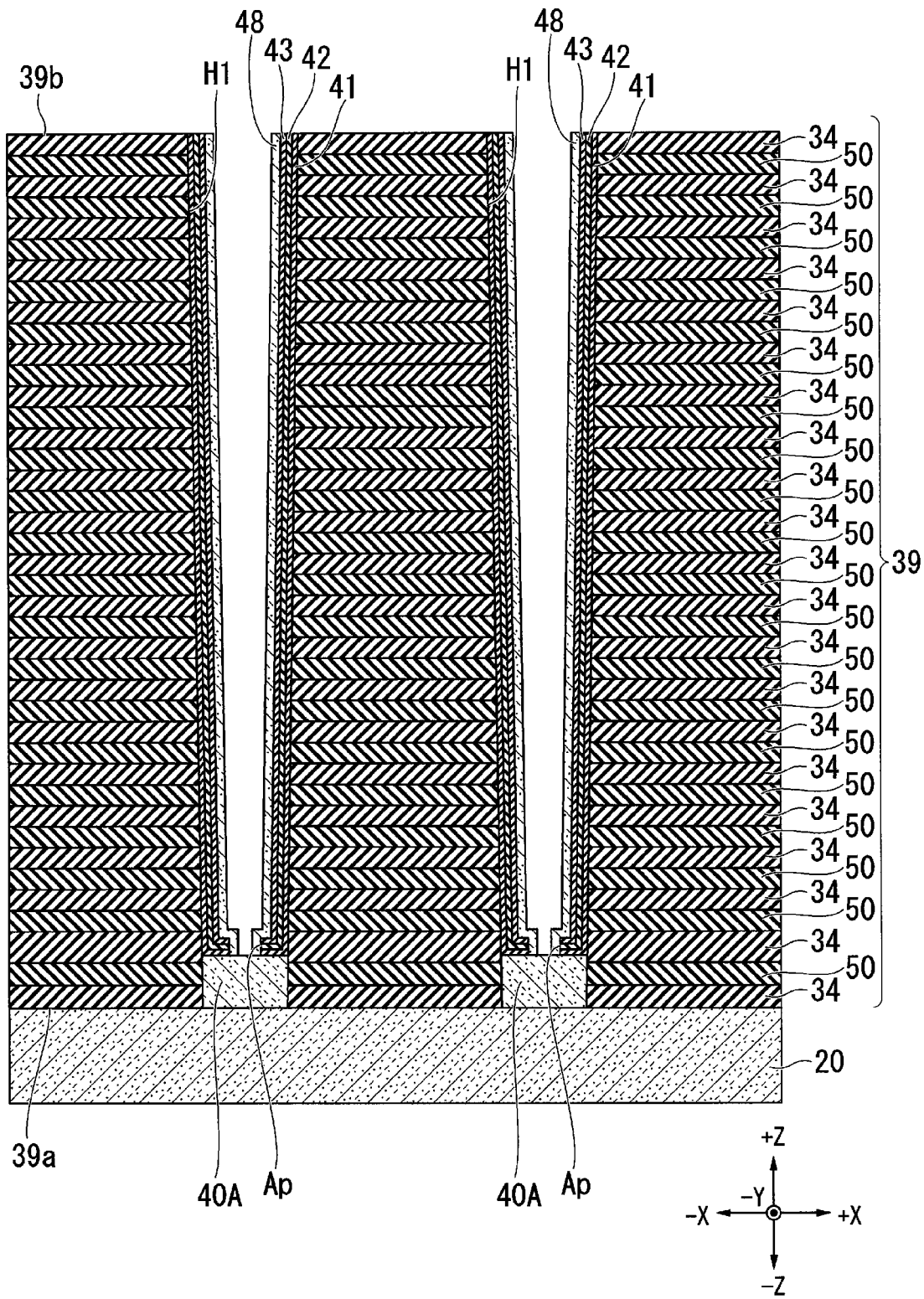

FIG. 11 is a cross-sectional diagram illustrating the channel film forming process. The channel film 48 is formed on an inner wall of the tunnel oxide film 43. Since the opening Ap is formed at the bottom of the tunnel oxide film 43, the channel film 48 is connected from an upper surface 39b of the stacked body 39 to an upper surface of the first columnar portion 40A. The channel film 48 is doped with impurities during film formation. The impurities are supplied, for example, as a gas and are doped into the channel film 48. The impurities are selected from, for example, a group containing carbon (C), phosphorus (P), boron (B), and germanium (Ge), and are preferably carbon (C).

Figure 12:
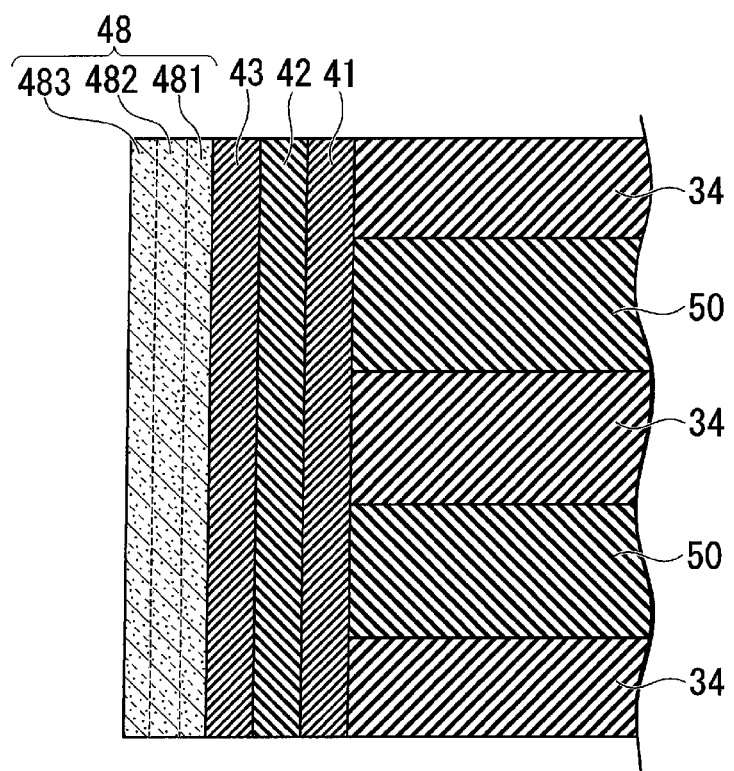

FIG. 12 is a cross-sectional diagram illustrating a vicinity of the channel film 48 in the channel film forming process. In the channel film forming process, for example, a first layer 481, a second layer 482, and a third layer 483 are formed in this order from an inner surface of the tunnel oxide film 43. When the first layer 481 and the third layer 483 are formed, impurities are not supplied. The first layer 481 and the third layer 483 are, for example, non-doped amorphous silicon. When the second layer 482 is formed, the impurities are supplied. The second layer 482 is, for example, carbon-doped amorphous silicon.

Subsequently, the first layer 481, the second layer 482, and the third layer 483 are heated. The amorphous silicon is crystallized by the heating to become polysilicon. The first layer 481 and the third layer 483 may be, for example, the non-doped polysilicon, and the second layer 482 may be, for example, the carbon-doped polysilicon. A part of the impurities contained in the second layer 482 are diffused to the first layer 481 and the third layer 483 by the heating. A crystal grain size of polysilicon forming the channel film 48 increases as a thickness of the channel film 48 increases at the time of heating.

Figure 13:
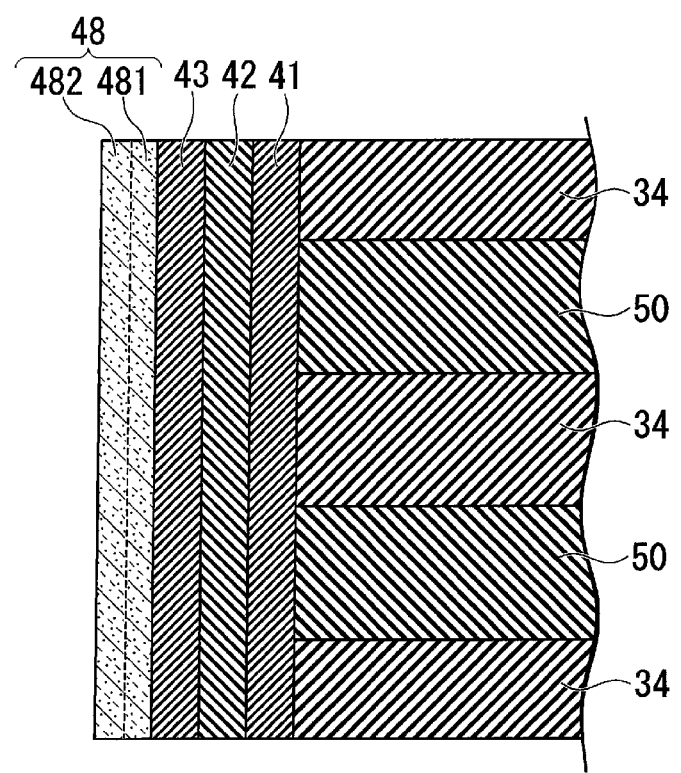
Figure 13:
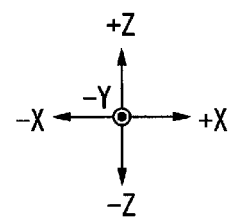

FIG. 13 is a cross-sectional diagram illustrating the slimming process. FIG. 13 is the cross-sectional diagram illustrating a vicinity of the channel film 48 in the slimming process. Slimming means a process of thinning a formed film. In the slimming process, a surface of the channel film 48 is oxidized and then the oxide film is etched. A surface oxidation of the channel film 48 is performed by using, for example, hydrogen peroxide. The etching of the oxide film is performed by using, for example, TMY (trimethyl-2 hydroxyethyl ammonium hydroxide). In the slimming process, a part of the channel film 48 is removed down to a region doped with impurities. In the slimming process, for example, a part of the channel film 48 is removed up to the second layer 482 of the channel film 48. The channel film 48 is thinned after a film is formed through the slimming process, and becomes the channel film 44 (see FIG. 5). The second layer 482 becomes, for example, the first region 44A of the channel film 44, and the first layer 481 becomes, for example, the second region 44B of the channel film 44.

Figure 14:
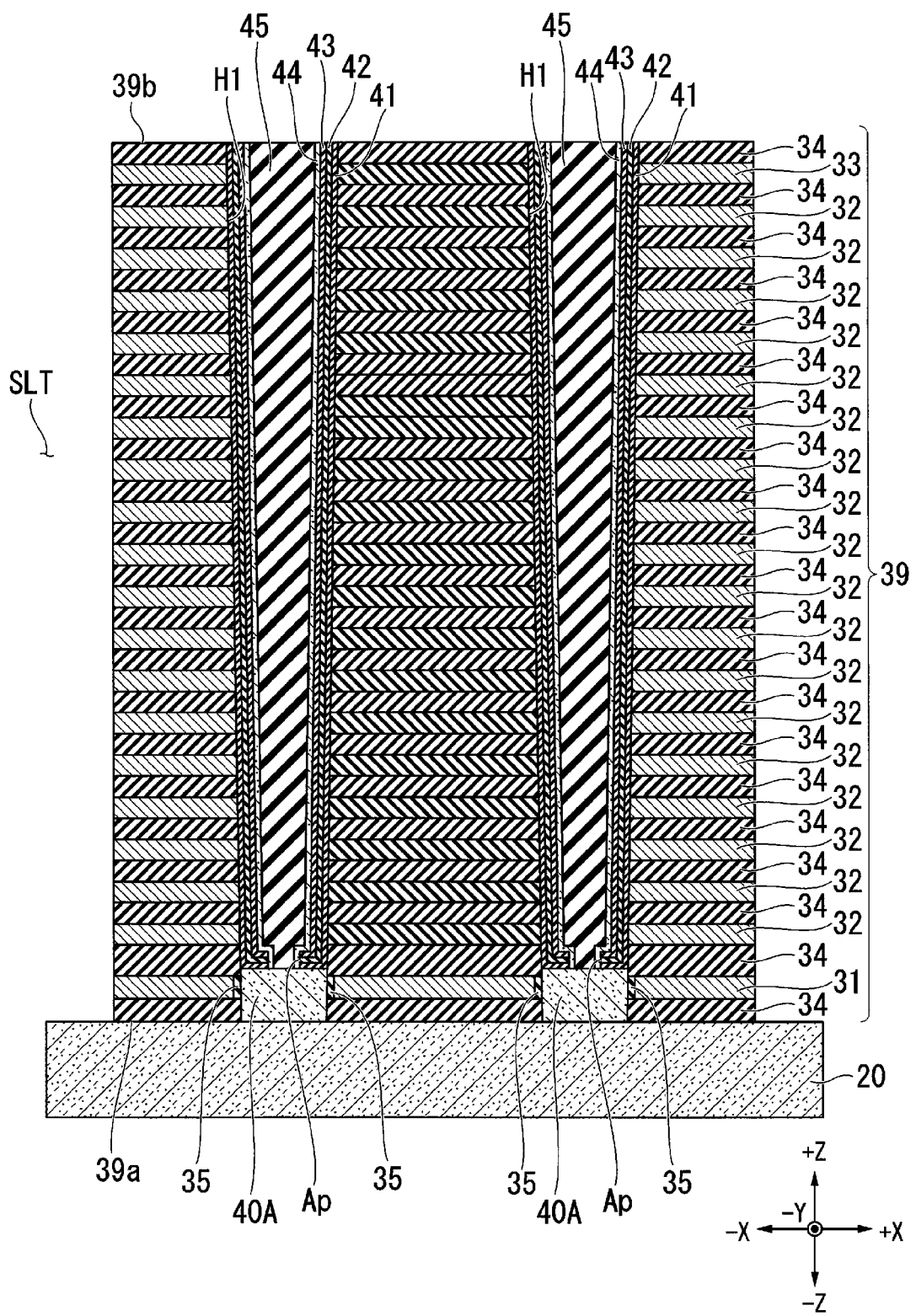

FIG. 14 is a cross-sectional diagram illustrating the core portion forming process and the replacement process. The core portion 45 is formed on an inner side of the slimmed channel film 44. The core portion 45 is filled in the inner side of a region surrounded by the channel film 44. By forming the core portion 45, the second columnar portion 40B is formed. Thereafter, the slit SLT is formed through the slitting process. Thereby, the plurality of string units SU are divided. In the replacement process, the replacement material 50 is removed by performing wet etching through the slits SLT. Subsequently, a space from which the replacement material 50 is removed is filled with a conductive material to form the conductive layers 31, 32, and 33. The stacked body 39 becomes the stacked body 30 by replacing the replacement material 50 with the conductive layers 31, 32, and 33. The stacked body 30 and the columnar body 40 are formed through the above processes. However, the manufacturing method of the semiconductor memory 1 is not limited to the above-described example.

According to the semiconductor memory 1 described above, the amount of cell current in the memory cell array 10 can be increased. The cell current is a current flowing through the channel film 44 in order to sense a state stored in the memory cell transistor MT. If a large cell current can flow through the channel film 44, the number of stacked memory cell transistors MT in the Z direction can be increased.

The cell current increase as the channel film 44 is thinned. By slimming the channel film 48, the channel film 44 is thinned. The channel film 48 is crystallized after a sufficient thickness is formed. The crystal grain size of the polysilicon forming the channel film 48 influences the cell current.

The impurities doped in the channel film 48 do not greatly influence a crystal grain size of a crystal grain. That is, the impurities doped in the channel film 48 are unlikely to greatly influence the cell current. Particularly, when the impurity is any of carbon, phosphorus, and boron, influence on the crystal grain size of the crystal grain is small. Carbon or germanium has the same valence as the silicon. When the impurity is carbon or germanium, the influence on a threshold voltage of the memory cell array 10 is small in particular.

Further, since the channel film 48 contains the impurities, a variation in the slimming amount of the channel film 48 in the slimming process can be reduced. The slimming amount is removed as the channel film 48 is etched. The variation in the slimming amount of the channel film 48 is a difference in the slimming amount at each point on an inner peripheral surface of the channel film 48 in the slimming process.

As described above, the channel film 48 is thinned by etching the oxide film after the surface is oxidized. The etching is easily performed in a portion having, for example, a crystal defect or a crystal interface. Accordingly, an etching rate of the channel film 48 differs depending on a location of the channel film 48. When the channel film 48 has no impurity, the variation in the etching rate of the channel film 48 results in the difference in the slimming amount at each point of the channel film 48.

The etching rate of the channel film 48 is different between the region doped with impurities (for example, the second layer 482) and the region not doped with impurities (for example, the third layer 483). The etching rate of the region doped with impurities is lower than the etching rate of the region not doped with impurities. When the channel film 48 contains the impurities, progress of etching of the channel film 48 is delayed in the region where the impurities are doped. That is, the region doped with impurities functions as a stopper layer of etching. The etching rate in the region doped with impurities is lower than the etching rate in the region not doped with impurities. Therefore, a variation in the etching rate in the region doped with impurities is smaller than the variation in the etching rate in the region not doped with impurities, and the variation in the slimming amount of the channel film 48 is reduced.

When the variation in the slimming amount of the channel film 48 in the slimming process is reduced, the variation in thickness of the channel film 44 after the slimming process is reduced. The thickness of the channel film 44 is a distance of a perpendicular line which goes from an inner peripheral surface of the channel film 44 toward an outer peripheral surface. If the variation in thickness of the channel film 44 is reduced, the thickness of the channel film 44 can be easily brought close to a design value, and occurrence of a manufacturing variation or the like can be reduced during mass production.

Second Embodiment

Next, a second embodiment will be described.

Figure 15:
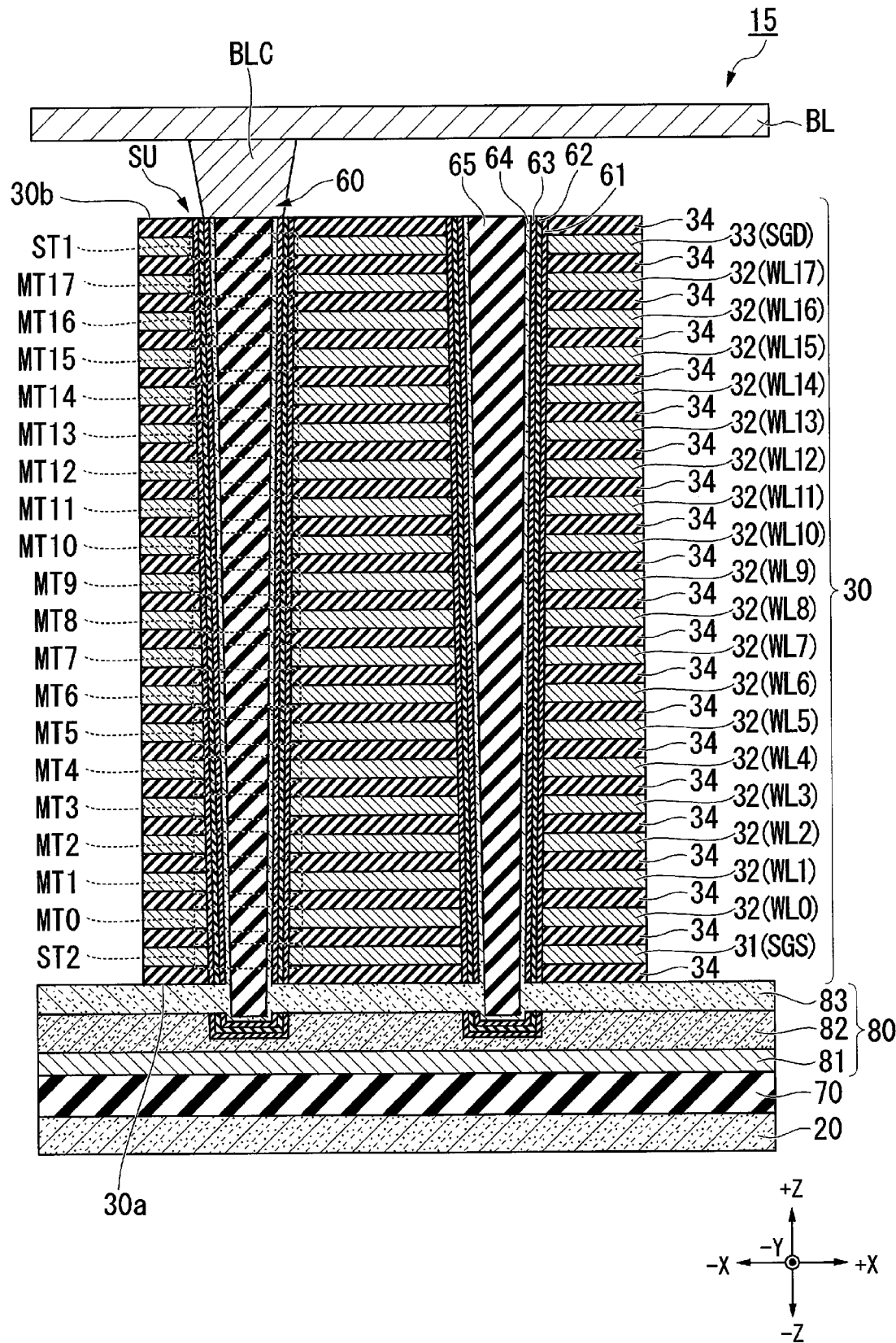
FIG. 15 is a cross-sectional diagram illustrating a partial region of a memory cell array according to a second embodiment.

FIG. 15 is a cross-sectional diagram illustrating a partial region of the memory cell array 15 according to the second embodiment. The memory cell array 15 according to the second embodiment differs from the memory cell array 15 illustrated in FIG. 4 in that an insulating layer 70 and a source layer 80 are provided between the semiconductor substrate 20 and the stacked body 30, and in a structure of a columnar body 60 in the stacked body 30. A configuration other than the configuration which will be described below is the same as the configuration of the memory cell array 10 according to the first embodiment.

The insulating layer 70 is provided between the semiconductor substrate 20 and the source layer 80. A driver circuit including a complementary MOS (CMOS) or the like may be provided inside the insulating layer 70.

The source layer 80 is provided between the insulating layer 70 and the stacked body 30. The source layer 80 has a conductive layer 81, a first semiconductor layer 82, and a second semiconductor layer 83. The conductive layer 81 is, for example, tungsten or tungsten silicide. The first semiconductor layer 82 and the second semiconductor layer 83 are, for example, silicon doped with impurities. The second semiconductor layer 83 is connected to the channel film 64 of the columnar body 60. The second semiconductor layer 83 surrounds the periphery of the portion where a block insulating film 61, an insulating film 62, and a tunnel oxide film 63 are removed in the XY plane.

The columnar body 60 includes the block insulating film 61, the insulating film 62, the tunnel oxide film 63, a channel film 64, and a core portion 65. The columnar body 60 extends from an upper surface 30b of the stacked body 30 to the first semiconductor layer 82. The block insulating film 61, the insulating film 62, and the tunnel oxide film 63 are partially removed in the second semiconductor layer 83. The channel film 64 is connected to the second semiconductor layer 83. The channel film 64 has a first region, which is doped with impurities, in contact with the core portion 65.

A manufacturing method of the memory cell array 15 according to the second embodiment includes, for example, a stack process, a hole forming process, an insulating film forming process, a channel film forming process, a slimming process, a core portion forming process, and a replacement process, in the same manner as in the manufacturing method of the memory cell array 10 according to the first embodiment.

Figure 16:
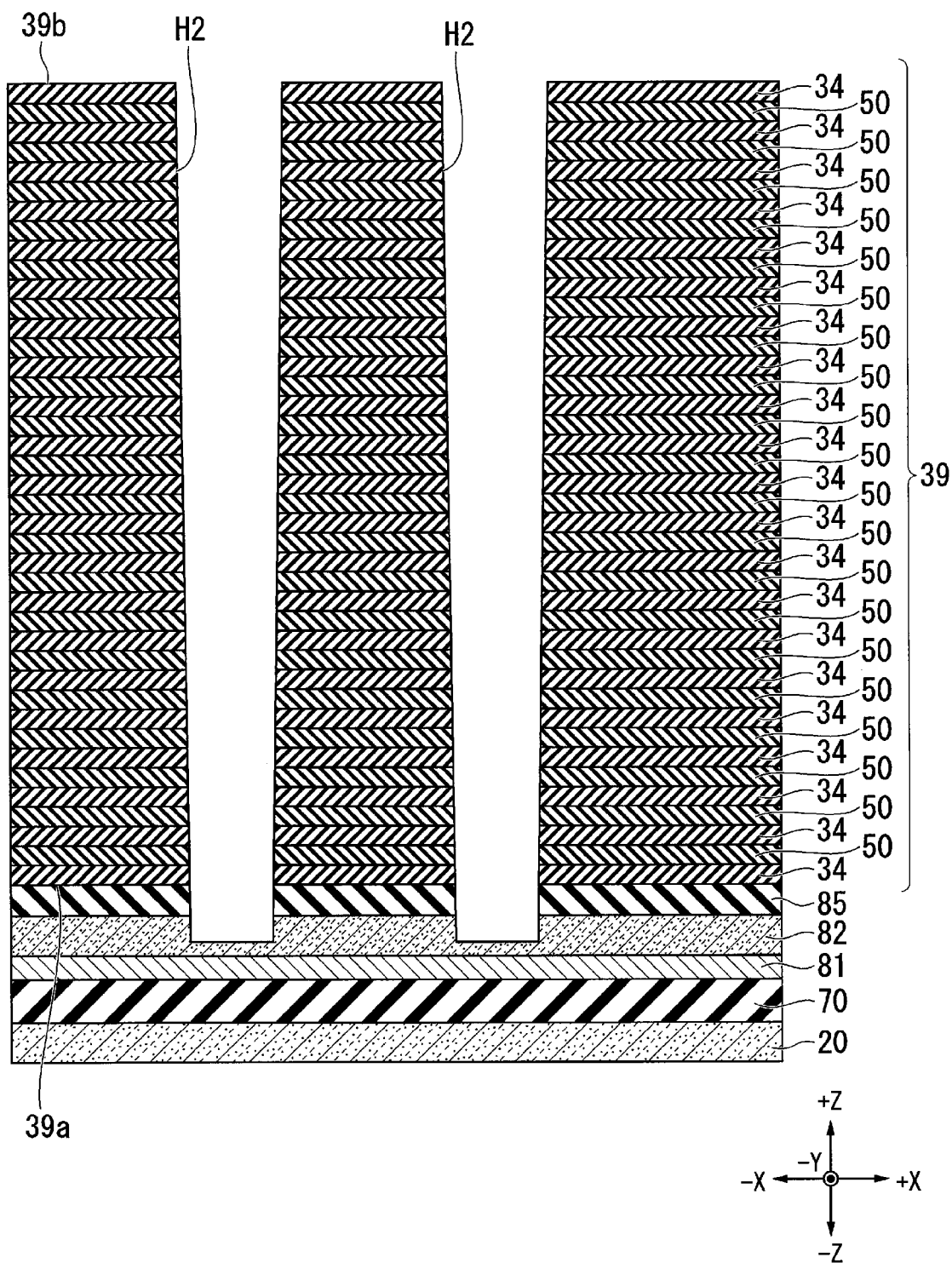
FIGS. 16-18 are cross-sectional diagrams illustrating an example of the manufacturing process of the memory cell array according to the second embodiment.

FIG. 16 is a cross-sectional diagram illustrating the stack process and the hole forming process. In the stack process, the insulating layer 70, the conductive layer 81, the first semiconductor layer 82, a replacement material 85, and the stacked body 39 are stacked in this order on the semiconductor substrate 20. Points in which the insulating layer 70, the conductive layer 81, the first semiconductor layer 82, and the replacement material 85 are stacked between the semiconductor substrate 20 and the stacked body 39 are different from the manufacturing method of the memory cell array 10 according to the first embodiment. In the hole forming process, holes H2 are formed in the stacked body 39. The holes H2 are formed from the upper surface 39b of the stacked body 39 to an inner side of the first semiconductor layer 82.

Figure 17:
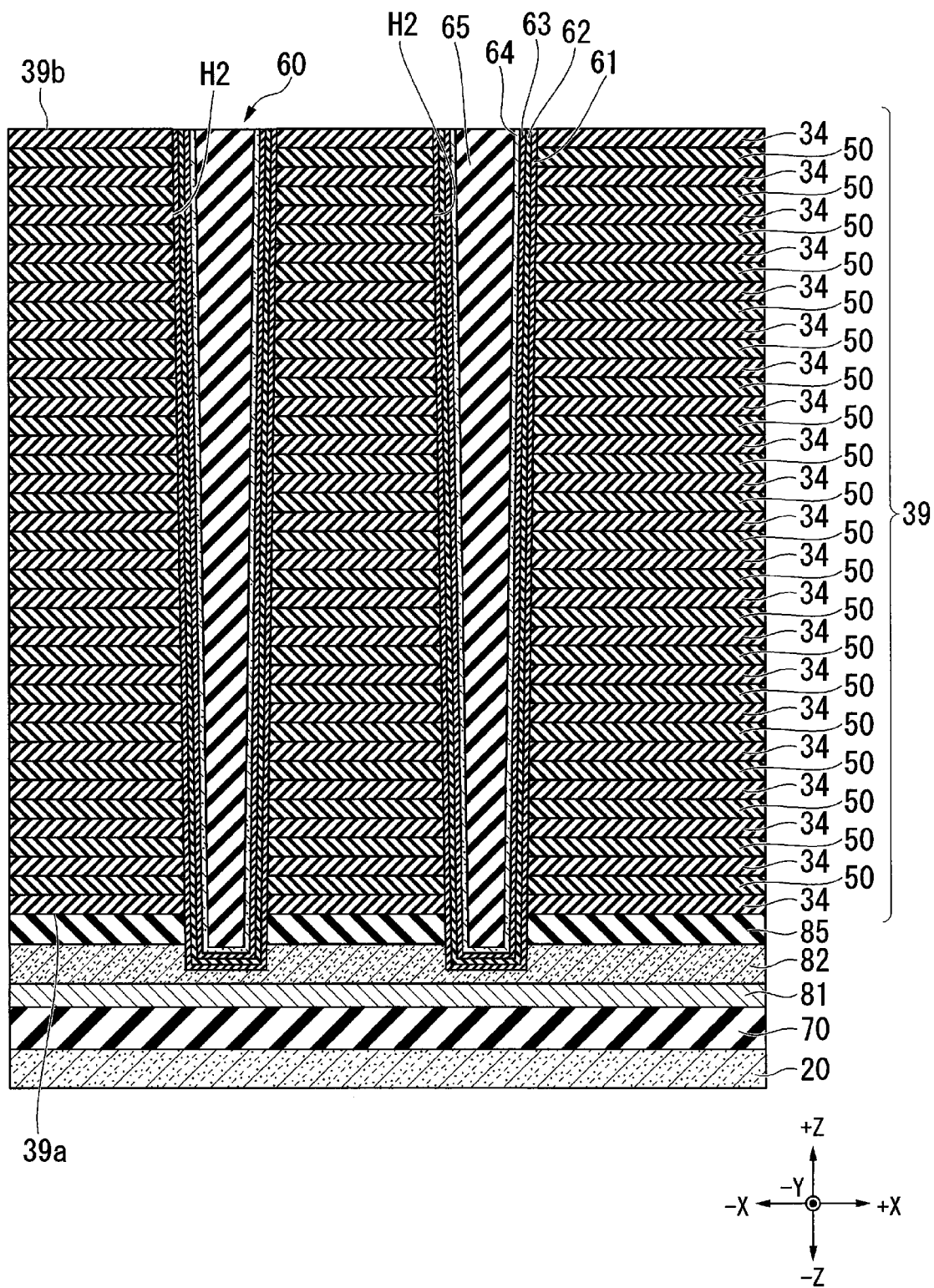

FIG. 17 is a cross-sectional diagram illustrating the insulating film forming process, the channel film forming process, the slimming process, and the core portion forming process. The insulating film forming process, the channel film forming process, the slimming process, and the core portion forming process are the same as in the manufacturing method of the memory cell array 10 according to the first embodiment.

Figure 18:
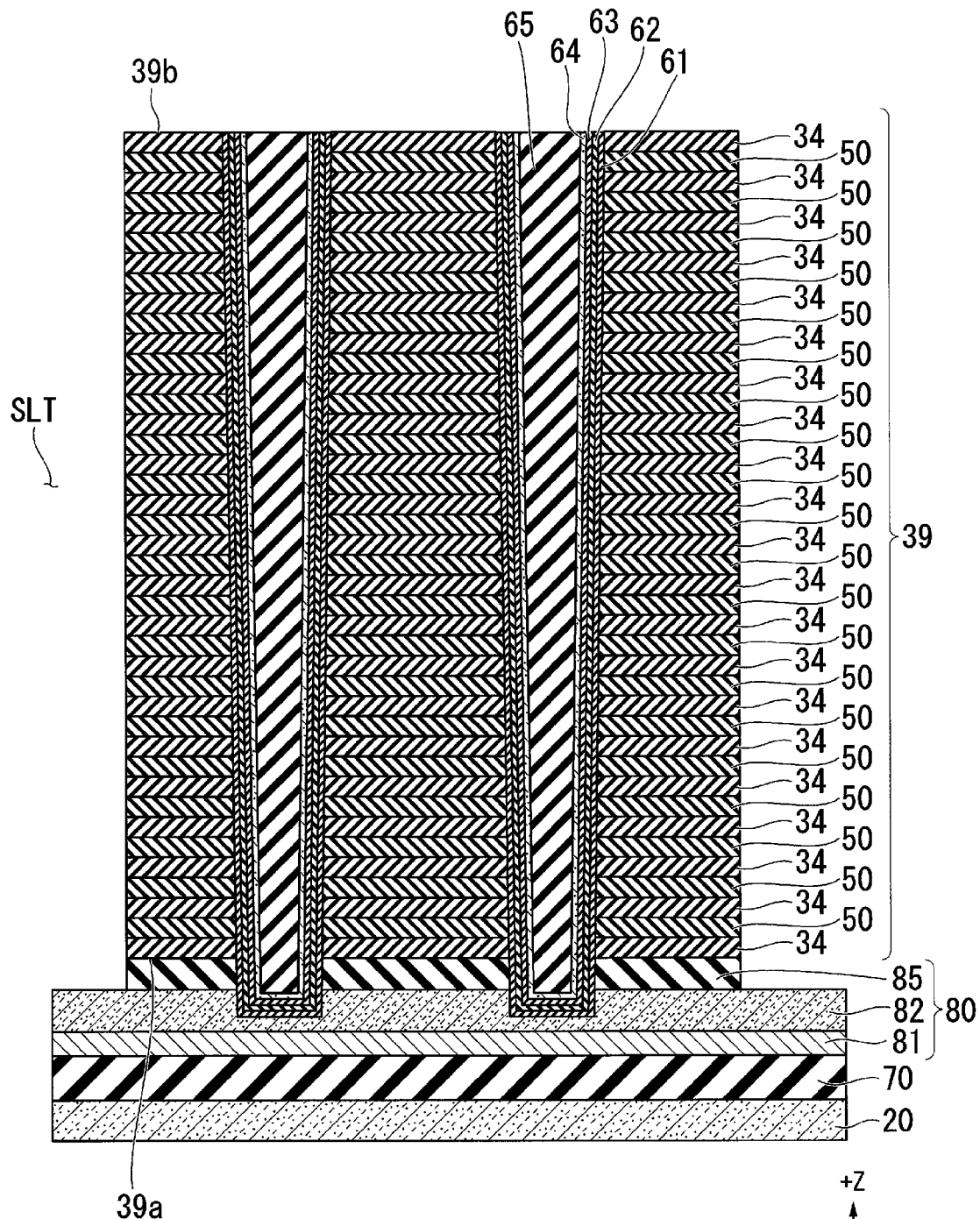

FIG. 18 is a cross-sectional diagram illustrating the replacement process. The slit SLT is formed from an upper surface 39b of the stacked body 39 to a surface of the first semiconductor layer 82 through a slit forming process. In the replacement process, the replacement material 85 is removed by the slit SLT. A part of the block insulating film 61, the insulating film 62, and the tunnel oxide film 63 is removed through a space from which the replacement material 85 is removed. A semiconductor material is filled in the space from which the replacement material 85, the block insulating film 61, the insulating film 62, and the tunnel oxide film 63 are partially removed, and a second semiconductor layer 83 is formed. The replacement material 50 is removed through the slit SLT. A space from which the replacement material 50 is removed is filled with a conductive material to form the conductive layers 31, 32, and 33. The stacked body 30 and the columnar body 60 are formed through the above-described processes. However, the manufacturing method of the semiconductor memory is not limited to the above-described example.

The amount of cell current of the memory cell array 15 can also be increased by the configuration described above in the same manner as in the first embodiment. Further, a variation in the slimming amount of the channel film in the slimming process can be reduced.

As described above, although some embodiments are described, the embodiments are not limited to the above-described examples. For example, an intersection portion between the conductive layer 32 and the columnar bodies 40 and 60 may be used as a dummy transistor which is not used for charge storage instead of being used as the memory cell transistor MT.

In the first embodiment and the second embodiment, an example in which a width decreases as the columnar bodies 40 and 60 proceed toward the semiconductor substrate 20 is illustrated. Shapes of the columnar bodies 40 and 60 are not limited to this. For example, the columnar bodies 40 and 60 may have a wedge shape in which a width increases at an intermediate height location in the Z direction, or a truncated cone shape in which a width increases toward the semiconductor substrate 20. The columnar bodies 40 and 60 may have a plurality of columnar bodies connected in the Z direction and may have step differences having different widths at an intermediate height location in the Z direction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
    a stacked body including a plurality of conductive layers and a plurality of insulating layers that are alternately stacked in a first direction; and
    a columnar body extending through the stacked body in the first direction and including a core portion, a channel film, a tunnel oxide film, and a charge storage film in this order from a center portion thereof, wherein
    the channel film includes at least one element as impurities, and has a first region in contact with the core portion, and a second region in contact with the tunnel oxide film,
    the first region is a semiconductor including the impurities, and
    the second region is a semiconductor including the impurities, and a concentration of the impurities in the second region is lower than that in the first region.

2. The semiconductor storage device according to claim 1, wherein the channel film has a first surface in contact with the core portion and a second surface in contact with the tunnel oxide film, the first surface includes the impurities, and the second surface includes the impurities, and a concentration of the impurities in the first surface is higher than a concentration of the impurities in the second surface.

3. The semiconductor storage device according to claim 2, wherein a concentration of the impurities in the channel film gradually decreases from the first surface to the second surface.

4. The semiconductor storage device according to claim 1, wherein the channel film is polysilicon having a region including the at least one element as impurities.

5. The semiconductor storage device according to claim 1, wherein the at least one element is selected from a group consisting of phosphorus, boron, and germanium.

6. The semiconductor storage device according to claim 1, wherein the at least one element is carbon.

7. The semiconductor storage device according to claim 1, wherein the concentration of the impurities in the first region is higher than or equal to $1\times10^{20}/cm^3$ and lower than or equal to $1\times10^{21}/cm^3$.

8. The semiconductor storage device according to claim 1, wherein the core portion includes the at least one element as impurities in a region in contact with the channel film.

9. The semiconductor storage device according to claim 1, wherein the concentration of the impurities in the second region is substantially zero.

10. The semiconductor storage device according to claim 1, wherein the columnar body further includes a block insulating film outside of the charge storage film, and the block insulating film is in contact with the stacked body.

* * * * *